United States Patent
Sanchez Delgado et al.

(10) Patent No.: US 12,163,993 B2
(45) Date of Patent: Dec. 10, 2024

(54) MEASURING APPARATUS AND A MEASURING METHOD OF ELECTROMAGNETIC INTERFERENCE

(71) Applicant: EMZER TECHNOLOGICAL SOLUTIONS, S.L., Barcelona (ES)

(72) Inventors: Albert Miquel Sanchez Delgado, Barcelona (ES); Joan Ramon Regue Morreres, Barcelona (ES); Miquel Ribó Pal, Barcelona (ES); Francisco Javier Pajares Vega, Barcelona (ES)

(73) Assignee: EMZER TECHNOLOGICAL SOLUTIONS, S.L., Barcelona (ES)

( * ) Notice: Subject to any disclaimer, the term of this patent is extended or adjusted under 35 U.S.C. 154(b) by 3 days.

(21) Appl. No.: 17/758,253

(22) PCT Filed: Dec. 29, 2020

(86) PCT No.: PCT/EP2020/088005
§ 371 (c)(1),
(2) Date: Jun. 30, 2022

(87) PCT Pub. No.: WO2021/136792
PCT Pub. Date: Jul. 8, 2021

(65) Prior Publication Data
US 2023/0027767 A1 Jan. 26, 2023

(30) Foreign Application Priority Data

Jan. 3, 2020 (EP) ..................... 20150184
Mar. 6, 2020 (EP) ..................... 20382162

(51) Int. Cl.
*G01R 31/00* (2006.01)
*B23K 9/133* (2006.01)
(Continued)

(52) U.S. Cl.
CPC ......... *G01R 31/002* (2013.01); *G01R 23/163* (2013.01); *G01R 23/18* (2013.01);
(Continued)

(58) Field of Classification Search
CPC ...... G01R 31/002; G01R 27/32; G01R 23/18; G01R 23/163; G01R 31/001; B23K 9/133; B23K 9/164; B23K 9/291
(Continued)

(56) References Cited

U.S. PATENT DOCUMENTS 6,356,852 B1 3/2002 Ke
2002/0053899 A1 5/2002 Adamian et al.
(Continued)

FOREIGN PATENT DOCUMENTS

GB 2466028 A 6/2010
WO 2013127911 A1 9/2013

OTHER PUBLICATIONS

Ferrigno, Luigi, Marco Laracca, and Antonio Pietrosanto. "Measurement of Passive R, L, and C Components Under Nonsinusoidal Conditions: The Solution of Some Case Studies." IEEE Transactions on Instrumentation and Measurement 57.11 (2008): 2513-2521.

*Primary Examiner* — Raul J Rios Russo
(74) *Attorney, Agent, or Firm* — Ice Miller LLP; Safet Metjahic

(57) ABSTRACT

The present invention relates to a measuring apparatus, comprising: an arbitrary waveform generator to generate, and inject to a coupling network, a combination of N test signals; the coupling network to couple the N test signals to an EUT, and the responses thereof and those signals generated by the EUT itself, to a measuring unit; the measuring unit to measure the electrical signals provided by the coupling network; and—a processing unit to process the N test
(Continued)

signals and the measured electrical signals, to obtain: the electromagnetic signals, noise or EMI generated by the EUT; and—the Z, Y or S parameters of the EUT or any other meaningful set of parameters that can be computed from the aforementioned ones or from voltages and currents. The invention also relates to a measuring method adapted to perform method steps with the apparatus of the invention.

17 Claims, 9 Drawing Sheets

(51) Int. Cl.
  *B23K 9/16* (2006.01)
  *B23K 9/29* (2006.01)
  *G01R 23/163* (2006.01)
  *G01R 23/18* (2006.01)
  *G01R 27/32* (2006.01)

(52) U.S. Cl.
  CPC .............. *G01R 27/32* (2013.01); *B23K 9/133* (2013.01); *B23K 9/164* (2013.01); *B23K 9/291* (2013.01)

(58) Field of Classification Search
  USPC ........................................................... 324/601
  See application file for complete search history.

(56) References Cited

U.S. PATENT DOCUMENTS

| | | | | |
|---|---|---|---|---|
| 2006/0017428 | A1* | 1/2006 | Lin ...................... | G01R 31/002 324/76.19 |
| 2006/0043979 | A1* | 3/2006 | Wu ...................... | G01R 31/001 324/627 |
| 2014/0361787 | A1* | 12/2014 | Paoletti ................ | G01R 31/002 324/537 |
| 2015/0097575 | A1* | 4/2015 | Hiraga ................ | G01R 31/002 324/537 |
| 2019/0285681 | A1* | 9/2019 | Yin ...................... | G01R 31/001 |
| 2021/0325438 | A1* | 10/2021 | Nakamura ............. | G01R 23/16 |

* cited by examiner

MEASURING APPARATUS AND A MEASURING METHOD OF ELECTROMAGNETIC INTERFERENCE

CROSS-REFERENCE TO RELATED PATENT APPLICATIONS

This is a U.S. National Phase Application under 35 U.S.C. § 371 of International Patent Application No. PCT/EP2020/088005, filed Dec. 29, 2020, and claims priority to European Patent Application No. 20382162.4, filed Mar. 6, 2020, and European Patent Application No. 20150184.8, filed Jan. 3, 2020, which are incorporated by reference in their entireties. The International Application was published on Jul. 8, 2021, as International Publication No. WO 2021/136792 A1.

FIELD OF THE INVENTION

The present invention relates, in a first aspect, to a measuring apparatus made to measure and obtain the electromagnetic signals or noise or electromagnetic interference (EMI) (from now on, conducted emissions) generated by an equipment under test (EUT) and the Z or Y or S parameters of the EUT or any other meaningful set of parameters that can be computed from the aforementioned ones or from voltages and currents (from now on, characterization parameters).

The measuring apparatus can be used to design a filter to attenuate the conducted emissions generated by the EUT or a matching network.

A second aspect of the present invention relates to a measuring method adapted to perform methodological steps with the apparatus of the first aspect of the invention.

BACKGROUND OF THE INVENTION

The measurement of the conducted emissions generated by an EUT and of the characterization parameters of the EUT is performed in the prior art independently, by means of two separated apparatuses, for example by means of a spectrum analyser, for the interference signals, and an impedance analyser or a network analyser, for the characterization parameters of the EUT.

The use of the above mentioned two separate apparatuses is accepted in the prior art as necessary to perform measurements, but it exhibits several problems. First, if the EUT is generating conducted emissions at the measuring ports, its characterization by means of the characterization parameters of the EUT may be very poor (the conducted emissions interfere with the measurements).

Besides, the use of those separate measurement apparatuses provides measurements at different times and under different operating conditions, so that one cannot know which was the conducted emissions generated by the EUT exactly at the same time and under the same operating conditions as the measurements of the characterization parameters were obtained, and vice versa.

This is a great disadvantage, which makes it very difficult and prone to errors for the skilled person, who needs the two types of measurement information (for example, for modelling the EUT). In consequence, these two kinds of information are linked by means of estimations, which is always a source of errors, impeding to meet the strict low error tolerances demanded by some regulations.

Some prior art documents are identified and briefly described below, since they represent some relevant examples of instruments and/or methodologies that can be used to measure the excitation-dependent parameters of an EUT (for instance, the impedance, S parameters, conversion loss of a mixer, conversion efficiency, etc.)

US2002053899A1 describes a test set to measure the S parameters of EUTs with more than two ports (multiport) by means of switching matrices placed between the signal generator, the receivers and the EUT. The instrument includes the signal processing to transform the conventional S parameters to mixed-mode S parameters in one side, and to a time-domain representation on the other side (equivalent to a reflectometer measurement).

GB2466028A describes a high frequency non-linear measurement system for analysing the behaviour of high power and high frequency amplifiers. The measurement system includes multiplexers and demultiplexers formed by filters, directional couplers and splitters, improving previous measurement systems that only used multiplexers and demultiplexers exhibiting poor transmission and reflection characteristics at certain frequencies.

Paper "Measurement of Passive R, L, and C Components Under Nonsinusoidal Conditions: The Solution of Some Case Studies", Luigi Ferrigno et al., IEEE Transactions on Instrumentation and Measurement, vol. 57, no. 11, November 2008, pp 2513-2521, describes a methodology to find the values of passive R, L and C components under conditions where the measurement signals are non-sinusoidal, based on linear system identification and modal parameter estimation techniques.

WO2013127911A1 describes a method for characterizing, at a given frequency, reflected waves of a frequency translating device (such as a mixer, in phase/quadrature modulators and demodulators, etc.) having at least two ports. The proposed method determines the frequency conversion factor of the EUT (with an integrated LO) by measuring the reflection factor using a one port network analyser, while applying known impedances at the other port of the EUT and a filter for image rejection. The method needs to assume reciprocity between up conversion and down conversion.

U.S. Pat. No. 6,356,852B1 describes an interface that allows to connect a two-port network analyser to a multiport EUT (that is, with more than two test ports). The interface device has at least two levels of switches, and is adapted to be coupled between the test ports of the EUT and a two-port network analyser.

However, while the instruments or methods disclosed by the prior art documents cited above have only been designed to measure some specific parameters of an EUT (such as the S-parameters or the frequency conversion), none of them have been built to measure both the excitation-independent and excitation-dependent parameters of an EUT at all, much less in a coherent and integrated way.

It is, therefore, necessary to provide an alternative to the state of the art which covers the gaps found therein, by providing a measuring apparatus which allows to perform measurements of both the conducted emissions generated by an EUT and the characterization parameters thereof.

SUMMARY OF THE INVENTION

To that end, the present invention relates to a measuring apparatus, comprising:
  an arbitrary waveform generator of N ports, wherein N is a natural number, configured and arranged to generate a combination of N test signals (linearly independent at all frequencies), one per port, and to inject said generated N test signals to N ports of a coupling network;

said coupling network configured to couple the N test signals from said arbitrary waveform generator to an EUT having M ports, where M is equal to, lower than or greater than N and to couple the responses of the EUT to these N test signals and those signals generated by the EUT itself, to a measuring unit;

said measuring unit of at least N ports configured and arranged to measure the electrical signals provided by the coupling network; and a processing unit configured and arranged to process said N test signals and said measured electrical signals, to obtain:
the conducted emissions generated by the EUT at at least some of its ports; and
the characterization parameters of the EUT.

As stated above, the EUT may have less than N ports (in this case, some of the ports of the EUT would remain unused), or more than N ports, in this case some of the ports of the EUT would remain unmeasured. With this understood, in the present section, the EUT will be supposed a M-port device.

For a preferred embodiment of the measuring apparatus of the first aspect of the present invention, the arbitrary waveform generator is configured and arranged to generate (simultaneously or sequentially) said combination of N test signals from discrete sequences of length L with autocorrelation $$Rxx(Rxx(n) = \frac{1}{L}\sum_{l=1}^{L} x[l]x^*[l+n]_L,$$

where x* represents the complex conjugate and $[l+n]_L$ represents a circular shift, with a modulus outside the origin lower or equal than $1/\sqrt{L}$ for $n \neq 0$, and modulus of the cross-correlation $$Rxy\left(Rxy(n) = \frac{1}{L}\sum_{l=1}^{L} x[l]y^*[l+n]_L\right)$$

with a modulus lower or equal than $1/\sqrt{L}$.

According to some embodiments, the measuring unit has N 2N or 3N ports.

For an embodiment, the measuring apparatus of the first aspect of the present invention, the arbitrary waveform generator is configured and arranged to simultaneously generate said combination of N test signals and/or simultaneously inject the generated N test signals to the N ports of the coupling network, and wherein:
the measuring unit is configured and arranged to simultaneously measure the electrical signals provided by the coupling network; and
the processing unit is configured and arranged to process the N test signals and the measured electrical signals, to simultaneously obtain:
the conducted emissions generated by the EUT at at least some of its ports; and
the characterization parameters of the EUT.

For an alternative embodiment, the arbitrary waveform generator is configured and arranged to inject the generated N test signals to the N ports of the coupling network, and wherein:
the measuring unit is configured and arranged to sequentially measure the electrical signals provided by the coupling network; and
the processing unit is configured and arranged to process the N test signals and the measured electrical signals, to sequentially obtain:
the conducted emissions generated by the EUT at at least some of its ports; and
the characterization parameters of the EUT.

Depending on the embodiment, the aforementioned N test signals are tones or chirp signals or modulated signals or pulses or impulses or wideband signals covering a frequency range to be measured.

For a preferred implementation of the embodiment for which the N test signals are pulses, they form pseudonoise (PN) sequence signals.

According to a further embodiment, the processing unit comprises processing means to process the received measured electrical signals using correlation techniques with the injected Ntest signals, to separate data representative of the conducted emissions generated by the EUT from data representative of the characterization parameters of the EUT.

For an embodiment, the coupling network contains Line Impedance Stabilization Network (LISN) channels configured and arranged:
to electrically couple an AC power supply to at least some of the ports of the EUT, and
to electrically decouple the arbitrary waveform generator and the measuring unit from the AC power supply network.

According to an embodiment, the processing unit is configured to compute a modal decomposition of data representative of the aforementioned measured electrical signals.

For an embodiment, the processing unit comprises the EMC (Electromagnetic compatibility) detectors (peak, quasi-peak and average detectors) applied directly on the modal decomposition of data representative of the aforementioned measured electrical signals.

For an embodiment, the signal generator is configured to generate and inject N test signals with a period smaller than the switching period of the EUT connected or to be connected thereto, to characterize the variations along time of conducted emissions generated by the EUT and characterization parameters of the EUT, whether because the signal generator is adapted to operate only with EUTs having a known switching period which is always greater than that provided by the signal generator, or, preferably, because the signal generator can be adapted, specifically the period of the test signals, to a plurality of different switching periods of different EUTs.

In this sense, this document discloses in a posterior section how the information required from the EUT is directly obtained from the measurements ($b_{2M}$ and $b_{4M}$). For instance, if the measured EUT features a switching-mode power supply at its ports, the switching period can be easily extracted from a single measurement of the conducted emissions (the first harmonic in the spectrum of these emissions provides the switching speed). Therefore, the instrument does not need to have preliminary information about the EUT (although this case is also embraced by the present invention, for other embodiments), but to perform a measurement of the conducted emissions, detect the first harmonic of the emissions, and then inject PN sequences (or other kinds of excitations) suitable to measure the changing impedance of that particular switching-mode power supply. The same applies to other kind of switching devices such as AC-AC, AC-DC, DC-AC and DC-DC converters.

It should be emphasized that a measurement is a complex process wherein the instrument may have to interact several times with the EUT in order to fully characterize it. At each iteration the instrument may generate different kind of excitations ($V_g$) to find features of the EUT that permit a full characterization of $S_{EUT}$ and $V_N$ (see description of these parameters in a posterior section in this document), even in time-varying situations, as the described above.

According to an embodiment, the processing unit is configured and arranged to process the N test signals and the measured electrical signals, and also to design a filter to attenuate the conducted emissions generated by the EUT.

For a further embodiment, alternative or complementary to the above mentioned embodiment, the processing unit is configured and arranged to process the N test signals and the measured electrical signals, and also to design a matching network for the optimal transference of the conducted emissions generated by the EUT.

The present invention also relates, in a second aspect, to a measuring method, comprising:
  a) generating and injecting test signals to at least some of the ports of an EUT;
  b) receiving (i.e., measuring) electrical signals from said at least some of the ports of the EUT, after said test signals have been injected thereto,
  c) simultaneously or sequentially measuring (i.e., processing/computing) on the received electrical signals:
    the conducted emissions generated by the EUT at said at least some of its ports; and
    the characterization parameters of the EUT.

Preferably, the method of the second aspect of the present invention comprises using the measuring apparatus of the first aspect of the invention to perform the method steps, wherein:
  step a) comprises generating, as said test signals, said combination of N test signals by means of said arbitrary waveform generator, at least one per port, and simultaneously or sequentially injecting the same to the ports of the EUT through the coupling network;
  step b) comprises receiving through the coupling network said electrical signals, including said responses of the EUT to the N test signals and said signals generated by the EUT itself; and
  step c) comprises:
    simultaneously or sequentially measuring, with the measuring unit, the electrical signals provided by the coupling network; and
    processing, with said processing unit, the N test signals and said measured electrical signals, to simultaneously or sequentially obtain:
      the conducted emissions generated by the EUT at at least some of its ports; and
      the characterization parameters of the EUT.

For another embodiment, the method of the second aspect of the present invention comprises using the measuring apparatus of the first aspect of the invention to perform the method steps, wherein:
  step a) comprises generating, as said test signals, said combination of N test signals by means of said arbitrary waveform generator, and simultaneously or sequentially injecting the same to at least some of the ports of the EUT through said coupling network;
  step b) comprises simultaneously or sequentially measuring, with said measuring unit, the electrical signals provided by the coupling network, including said responses of the EUT to the N test signals and said signals generated by the EUT itself; and
  step c) comprises:
    processing, with said processing unit, the N test signals and said measured electrical signals, to simultaneously or sequentially compute:
      the electromagnetic signals or noise or electromagnetic interference (EMI) generated by the EUT at at least some of its ports; and
      the Z or Y or S parameters of the EUT or any other meaningful set of parameters that can be computed from the aforementioned ones or from voltages and currents.

According to an embodiment of the method of the second aspect of the present invention, the method comprises:
  building a circuit model or modal model of the EUT; and
  designing an optimal filter or matching network, and/or components thereof, by predicting the levels of conducted emissions generated by the EUT when virtually connecting said built circuit and/or modal models to the filter or matching network components and simulate their operation.

For an embodiment of the method of the second aspect of the present invention, the step of designing the optimal filter further comprises carrying out an optimization process in order to reduce the number filter components combinations to be virtually connected to and simulated with the built circuital and modal models.

According to an implementation of that embodiment, the optimization algorithm comprises at least one of the following algorithms, or a combination thereof: genetic algorithm, gradient algorithm, conjugated gradient algorithm, and Broyden-Fletcher-Goldfarb-Shannon algorithm.

BRIEF DESCRIPTION OF THE FIGURES

In the following some preferred embodiments of the invention will be described with reference to the enclosed figures. They are provided only for illustration purposes without however limiting the scope of the invention.

FIG. 1. Comparison between the interferent sources ($V_{n1}$ and $V_{n2}$) of the EUT and the estimated ones.

DESCRIPTION OF THE PREFERRED EMBODIMENTS

In the present section some working embodiments of the measuring apparatus of the first aspect of the present invention and of the different signals intervening in the operation thereof, will be described with reference to the Figures.

The description below refers to embodiments of the apparatus/method of the present invention to perform sequential measurements (Approach A) of conducted emissions and impedance and also simultaneous measurements (Approach B) thereof.

Figure 1:
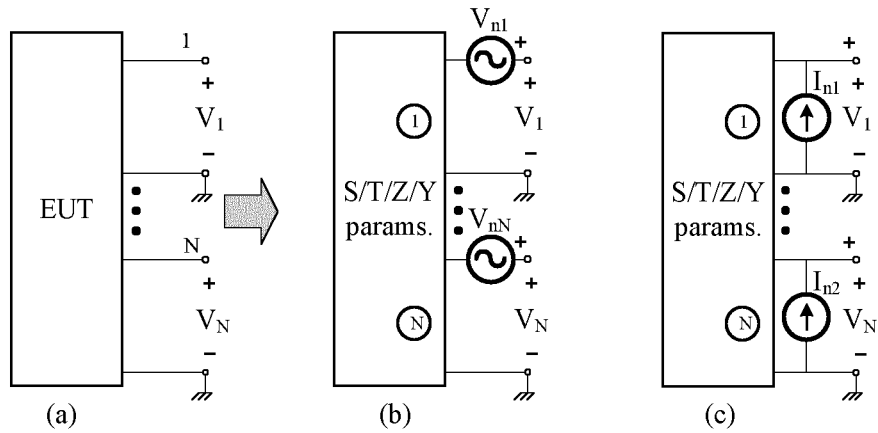
FIG. 1. EUT models, among others, that can be generated using the instrument comprising the measuring apparatus of the first aspect of the present invention: a) a N-port EUT; b) Thevenin equivalent model; c) Norton equivalent model.

Measurement Steps to Perform a Sequential or Simultaneous Measurement of Conducted Emissions and Impedance:

The embodiments described above for the measuring apparatus of the first aspect of the present invention, allow the computation of the conducted emissions and characterization parameters of an EUT. These can be combined to obtain a generic equivalent Thevenin/Norton model of the EUT. By a generic Thevenin/Norton equivalent it is understood in this document any characterization of an EUT (FIG. 1.a) of the form of $y=Ax+y_0$, where y is a column vector of electrical magnitudes taken as responses, x is a column vector of electrical magnitudes taken as excitations, the matrix A encapsulates the response of the equipment to these excitations (contains its characterization parameters), and $y_0$ contains the effect of the conducted emissions. The electrical magnitudes can be any combination of voltages and currents. x, y and $y_0$ can be understood as containing time or frequency characterizations of electrical magnitudes (if time-domain magnitudes are used, Ax must be understood as a matrix convolution). Therefore, the matrix A can be, among others, any of the commonly used parameters (scattering (S) parameters, impedance parameters (Z), admittance parameters (Y), chain scattering or chain transfer (T) parameters, hybrid (H) parameters, chain (ABCD) parameters, etc.) and the column vector $y_0$ could represent series voltage sources, shunt current sources, wave sources, etc. In graphical representations of these parameters, it is common to mix elements from different representations, as in FIG. 1.b, where the series voltage sources would naturally fit in an EUT characterization using a Z parameter matrix, or in FIG. 1.c, where the shunt current sources would naturally fit in a characterization using a Y parameter matrix. Since most matrix characterizations can be transformed one into another, mixed graphical characterizations such as those of FIG. 1.b or FIG. 1.c are also possible. In order to measure an equivalent Thevenin/Norton model of the EUT the instrument simultaneously or sequentially measures the conducted emissions and the characterization parameters of any EUT connected to it, and, with this information, constructs its equivalent model.

Figure 2:
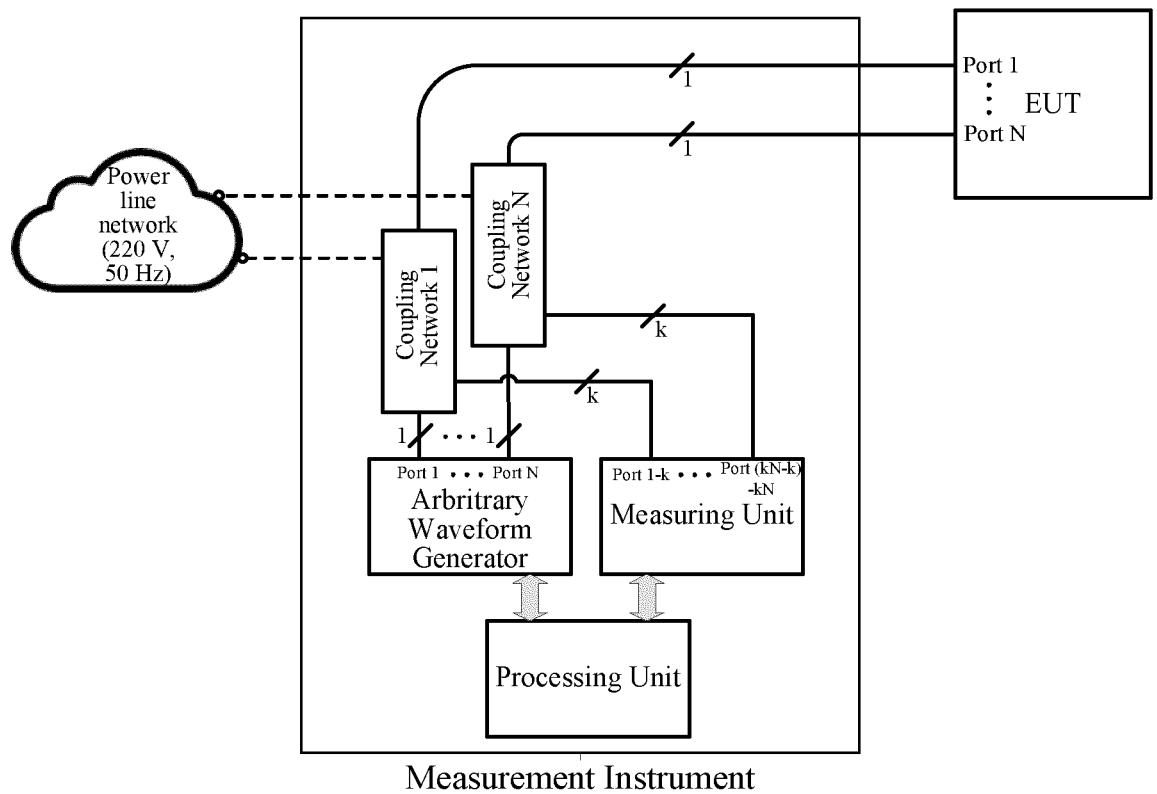
FIG. 2. Block diagram of the measurement instrument/apparatus of the first aspect of the present invention electrically coupled to an EUT and to a power line network, for an embodiment.

The block diagram of the instrument that can perform these measurements is shown in FIG. 2, according to an embodiment of the measuring apparatus of the first aspect of the present invention. It is designed to measure an EUT of N ports (if the EUT has less than N ports, some of the ports of the EUT would remain unused; if the EUT has more than N ports, some of the ports of the EUT would remain unmeasured; with this understood, in the following, the EUT will be supposed an N-port device, for the here described embodiments). The instrument consists of an N-port Arbitrary Waveform Generator; a k×N-port Measuring Unit, being k usually 1, 2 or 3; N Coupling Networks that inject a signal dependent on the signal generated by the Arbitrary Waveform Generator to the ports of the EUT, and inject a signal dependent of the response of EUT to the aforementioned excitations to the k×N ports of the Measuring Unit. The Processing Unit will perform most of the computations specified below. In the particular embodiment shown in FIG. 2, the Coupling Networks include the circuitry typical of a channel of an LISN, since it is intended to characterize the mains or power terminals of the EUT. A different embodiment of the invention designed to characterize other kind of terminals, would not have the Coupling Networks connected to the mains through LISN channels.

The Arbitrary Waveform Generator and the Measuring Unit can work in a base band configuration or include frequency mixers, upconverters, downconverters, etc. The Measuring Unit contains k×N signal measurement devices, which can be actual or equivalent (a multiplexing schema could be used if needed).

The Processing Unit can be embedded into the physical instrument or be hosted in an external PC or the Cloud.

The Coupling Networks can be made in a variety of configurations, none of which refers to a switching matrix. For instance, using power dividers and directional couplers, impedance bridges, circulators, voltage or current probes, etc. This definition means that in such coupling networks all ports are always interconnected (contrary to what can happen in a switching matrix with more inputs than outputs or vice versa, where only those ports placed at the switching position are interconnected).

Figure 3:
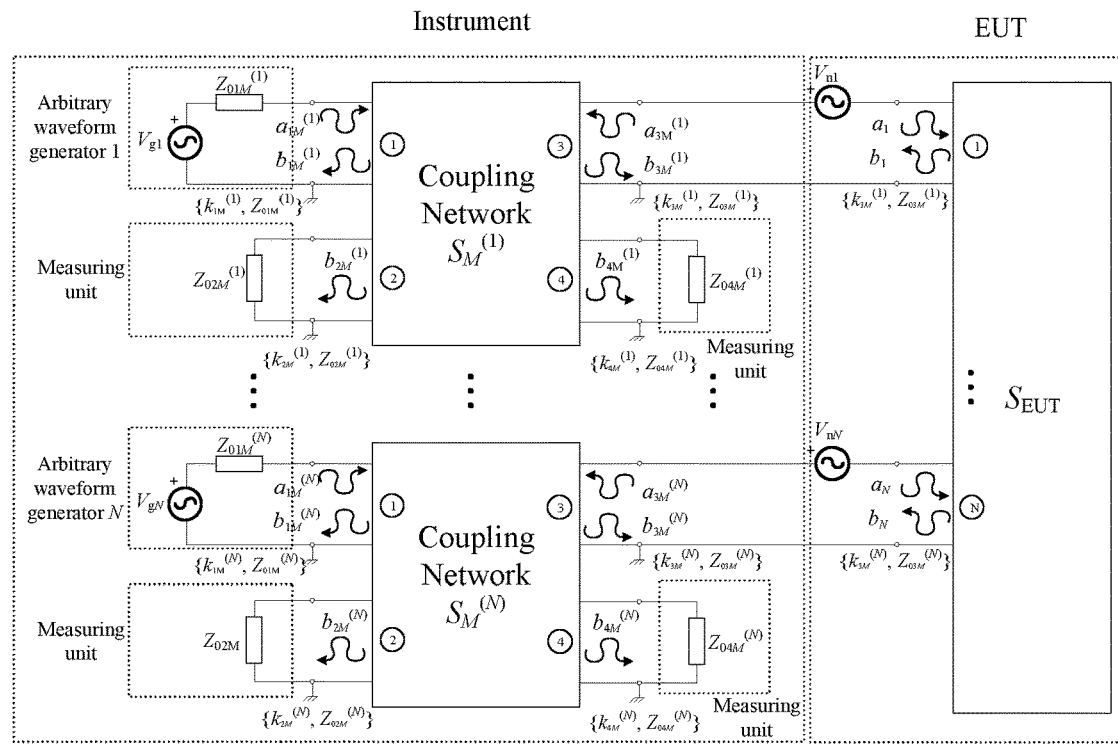
FIG. 3. Block diagram of a model of the measurement instrument of the first aspect of the present invention, for an embodiment.

In order to demonstrate the feasibility of the instrument, it can be modelled as seen in FIG. 3 and described as follows. In this analysis, 4-port Coupling Networks are supposed, although three-port Coupling Networks would be enough for the analysis performed. In a real implementation, the fourth port could be used, for instance, and with the appropriate Coupling Network, to sense the level of the signals injected by the Arbitrary Waveform Generator. In the following analysis, the Coupling Networks are very general. The analysis is performed in the frequency domain. Since any signal admits either a time-domain or a frequency-domain characterization, the analysis performed is general. For the purpose of the analysis, normalized waves are used, but it is understood that the instrument can measure other kinds of electrical signals (that can be expressed as combinations of normalized waves). For the following analysis, ports 1 of the Coupling Networks have a reference impedance equal to the internal impedance of the corresponding Arbitrary Waveform Generator ports. And ports 2 and 4, have a reference impedance equal to the input impedance of the corresponding Measuring Unit ports (a value of k=2 is supposed, although the analysis could analogously be performed for other values of k).

The N signal generators of the block diagram of FIG. 2 can be characterized, without loss of generality, by their open-source voltage $V_{gi}$ and internal impedance $Z_{01M}^{(i)}$, i=1, . . . , N, and the k N Measuring Unit ports (in FIG. 3, 2N) can be characterized, without loss of generality, by their input impedance $Z_{02M}^{(i)}$ and $Z_{04M}^{(i)}$, i=1, . . . , N. The Arbitrary Waveform Generator and the Measuring Unit devices are coupled to the EUT ports by means of the N Coupling Networks, characterized again, without loss of generality, by their S-parameter matrix, $S_M^{(i)}$, i=1, . . . , N. The following analysis is performed, without loss of generality, under the assumption of two Measuring Unit ports for each EUT port. The analysis could also be performed for an arbitrary number of Measuring Unit devices for each EUT port (k). In particular, the case of k=1 can be easily taken into account in the following equations by equating the relevant S parameters of the relevant $S_M^{(i)}$ matrix to 0.

Figure 4:
FIG. 4. Definition of normalized waves used for the analysis in the frequency domain performed for the model of FIG. 3.

The following analysis has been performed using a very general definition on normalized waves (and, therefore, of S parameters), as seen in FIG. 4. The parameters k and $Z_0$ used for the definition of a normalized wave are indicated below the port. As can be seen, to simplify the computations, the values on the different parameters $Z_0$ used at ports 1, 2 and 4 of the N Coupling Networks are equal to the internal impedance of the Arbitrary Waveform Generator and the input impedances of the Measuring Unit ports. The values of k and $Z_0$ at their port 3 are set to accommodate the desired wave definitions at the port of the EUT.

Let it be the following column vectors, $$a_{jM} = \begin{bmatrix} a_{jM}^{(1)} \\ \vdots \\ a_{jM}^{(N)} \end{bmatrix} b_{jM} = \begin{bmatrix} b_{jM}^{(1)} \\ \vdots \\ b_{jM}^{(N)} \end{bmatrix} a = \begin{bmatrix} a_1 \\ \vdots \\ a_N \end{bmatrix} b = \begin{bmatrix} b_1 \\ \vdots \\ b_N \end{bmatrix} V_n = \begin{bmatrix} V_{n1} \\ \vdots \\ V_{nN} \end{bmatrix} V_g = \begin{bmatrix} V_{g1} \\ \vdots \\ V_{gN} \end{bmatrix},$$

with=1, . . . , 4. If the S parameter matrix of the EUT and Coupling Networks are $$S_{EUT} = \begin{bmatrix} s_{11} & \cdots & s_{1N} \\ \vdots & \ddots & \vdots \\ s_{N1} & \cdots & s_{NN} \end{bmatrix} \text{ and } S_M^{(i)} = \begin{bmatrix} s_{11M}^{(i)} & \cdots & s_{14M}^{(i)} \\ \vdots & \ddots & \vdots \\ s_{41M}^{(i)} & \cdots & s_{44M}^{(i)} \end{bmatrix},$$

with i=1, . . . , N, let it be the diagonal matrices $$S_{ijM} = \begin{bmatrix} s_{ijM}^{(1)} & & 0 \\ & \ddots & \\ 0 & & s_{ijM}^{(N)} \end{bmatrix},$$

with i=1, . . . , 4, j=1, . . . , 4. Finally, let it be the diagonal matrices $$K_{jM} = \begin{bmatrix} k_{jM}^{(1)} & & 0 \\ & \ddots & \\ 0 & & k_{jM}^{(N)} \end{bmatrix},$$

with j=1, . . . , 4.
Then, $b = S_{EUT} a$ $a_{1M} = K_{1M} V_g$ $a_{3M} = K_{3M} V_n + b$ $b_{3M} = K_{3M} V_n + a$ $b_{1M} = S_{11M} a_{1M} + S_{13M} a_{3M}$ $b_{3M} = S_{31M} a_{1M} + S_{33M} a_{3M}$ $b_{2M} = S_{21M} a_{1M} + S_{23M} a_{3M}$ $b_{4M} = S_{41M} a_{1M} + S_{43M} a_{3M}$ From these equations, it follows that $b_{3M} = (I_N - S_{33M} S_{EUT})^{-1} S_{31M} a_{1M} + (I_N - S_{33M} S_{EUT})^{-1} S_{33M}$
$(I_N - S_{EUT}) K_{3M} V_n a_{3M} = S_{EUT} (I_N - S_{33M} S_{EUT})^{-1}$
$S_{31M} a_{1M} + (I_N + S_{EUT} (I_N - S_{33M} S_{EUT})^{-1} S_{33M}) (I_N - S_{EUT}) K_{3M} V_n.$ From these, all other waves (and therefore, the voltages and currents) at all the ports of the circuit of FIG. 3 can be easily computed.

From these equations, several measurement strategies (time-domain, frequency-domain, mixed-domain, or spread-spectrum) can be envisaged.

For instance, two very basic approaches, which can be enriched at several stages, would be the ones described below.

Approach A:

Suppose an EUT emitting stationary interference. First, the effect of $V_n$ is measured when $V_g = 0$ ($a_{1M}=0$), yielding $b_{2M0} = S_{23M} a_{3M} = S_{23M} (I_N + S_{EUT} (I_N - S_{33M} S_{EUT})^{-1} S_{33M})$
$(I_N - S_{EUT}) K_{3M} V_n$ $b_{4M0} = S_{43M} a_{3M} = S_{43M} (I_N + S_{EUT} (I_N - S_{33M} S_{EUT})^{-1} S_{33M})$
$(I_N - S_{EUT}) K_{3M} V_n.$ If then adequately timed (synchronized with the interference or with the 50-Hz mains signal, . . . ) measurements are performed with $V_g \neq 0$ ($a_{1M} \neq 0$), the following waves are measured, $b_{2M} = S_{21M} a_{1M} S_{23M} a_{3M} = (S_{21M} + S_{23M} S_{EUT} (I_N - S_{33M} S_{EUT})^{-1} S_{31M}) a_{1M} + b_{2M0}$ $b_{4M} = S_{41M} a_{1M} S_{43M} a_{3M} = (S_{41M} + S_{43M} S_{EUT} (I_N - S_{33M} S_{EUT})^{-1} S_{31M}) a_{1M} + b_{4M0}$ If N linearly independent (at all frequencies) (column) vectors $a_{1M, k}$=1, . . . , N are generated, and its responses measured, the following excitation and response matrices (made up of column vectors) can be constructed, $A = [a_{1M,1} \ldots a_{1M,N}]$ $B_2 = [b_{2M,1} - b_{2M0} b_{2M,N} \ldots b_{2M0}]$ $B_4 = [b_{4M,1} - b_{4M0} b_{4M,N} \ldots b_{4M0}],$ with $$B_2=(S_{21m}+S_{23M}S_{EUT}(I_N+S_{33M}S_{EUT})^{-1}S_{31M})A$$

$$B_4=(S_{41M}+S_{43M}S_{EUT}(I_N+S_{33M}S_{EUT})^{-1}S_{31M})A.$$

Since A is invertible, $S_{EDT}$ can be computed from either expression. For instance, $$S_{EUT}=(I_N+S_{23M}^{-1}(B_2A^{-1}-S_{21M})S_{31M}^{-1}S_{33M})^{-1}(S_{23M}^{-1}(B_2A^{-1}-S_{21M})S_{31M}^{-1}) \quad \text{Equation 1}$$

Once $S_{EUT}$ is known, $V_n$ can be readily computed.

Figure 5:
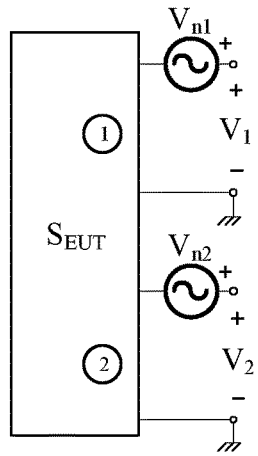
FIG. 5. Two-port EUT model: The S-parameter matrix $S_{EUT}$ characterizes the internal impedance of the EUT, and the two voltage sources ($V_{n1}$ and $V_{n2}$) characterize the conducted emissions generated by the EUT, for an embodiment used for the examples of approaches A and B described below.
Figure 6:
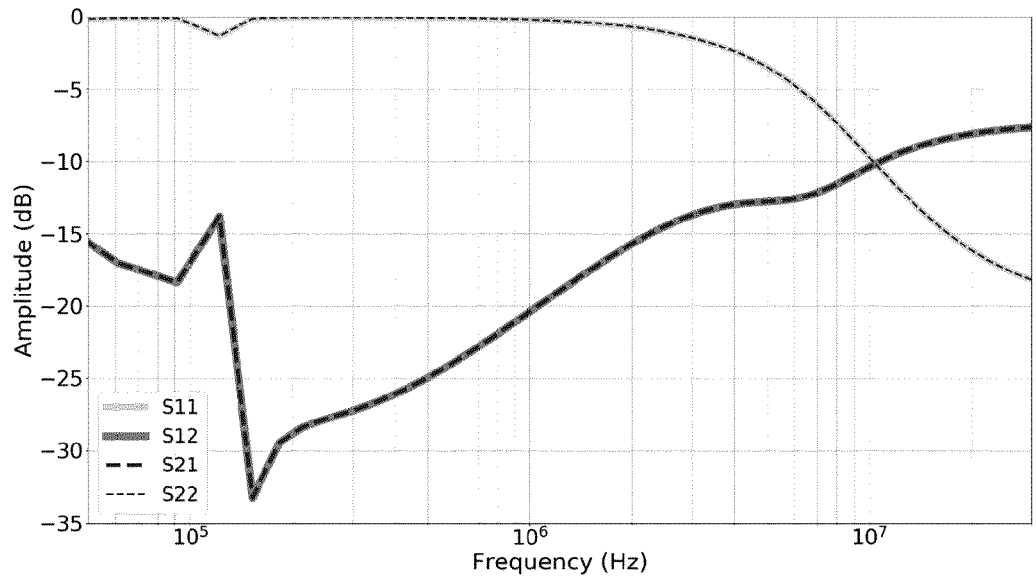
FIG. 6. The S-parameters of the EUT used for the examples of approaches A and B, for the EUT model of FIG. 5.
Figure 7:
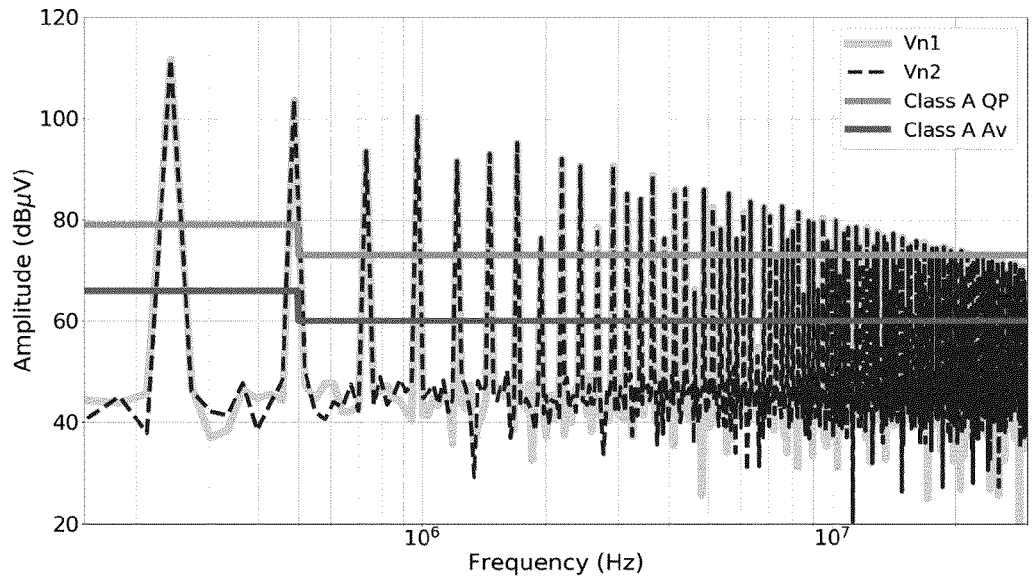
FIG. 7. Magnitude of the Spectra of the two noise voltage sources also for the examples of approaches A and B, for the EUT model of FIG. 5. CISPR limits for class A equipment are plotted for comparison purposes.

Example A: Consider the case of a two-port EUT modelled using the characterization of FIG. 5 (to select one, although any other characterization as described above could be used), that consists of a S-parameter network ($S_{EUT}$) that characterizes the internal impedance of the EUT (its characterization parameters), and two noise voltage sources ($V_{n1}$ and $V_{n2}$) that characterize the interference generated by the EUT. Port 1 of the EUT is the line-ground port, and port 2 the neutral-ground port. The S parameters used in this example (based on actual measurements) are shown in FIG. 6, and the magnitude of the two noise-voltage sources are shown in FIG. 7. Some CISPR limits are also plotted only for comparison purposes.

The Coupling Networks considered for the instrument feature each a CISPR-16 50Ω//50 μH LISN channel, a limiter attenuator and a directional coupler.

Figure 8:
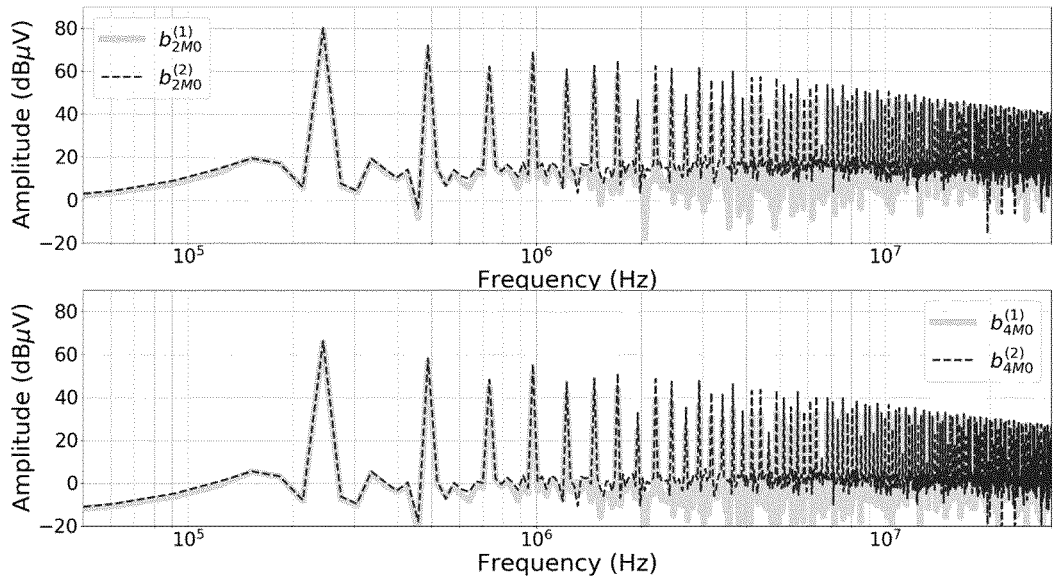
FIG. 8. Signals (1) $b_{2M0}$ and (2) $b_{4M0}$ measured with $V_{g1}$ and $V_{g2}$ switched off, for the example of approach A.
Figure 9:
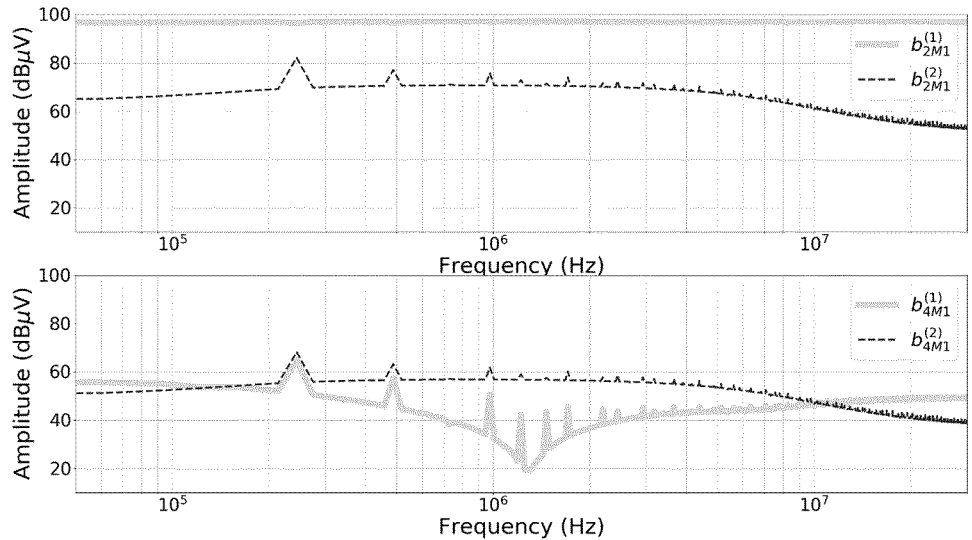
FIG. 9. Signals (1) $b_{2M1}$ and (2) $b_{4M1}$ measured with $V_{g1}$ switched on and $V_{g2}$ switched off, for the same example of approach A.
Figure 10:
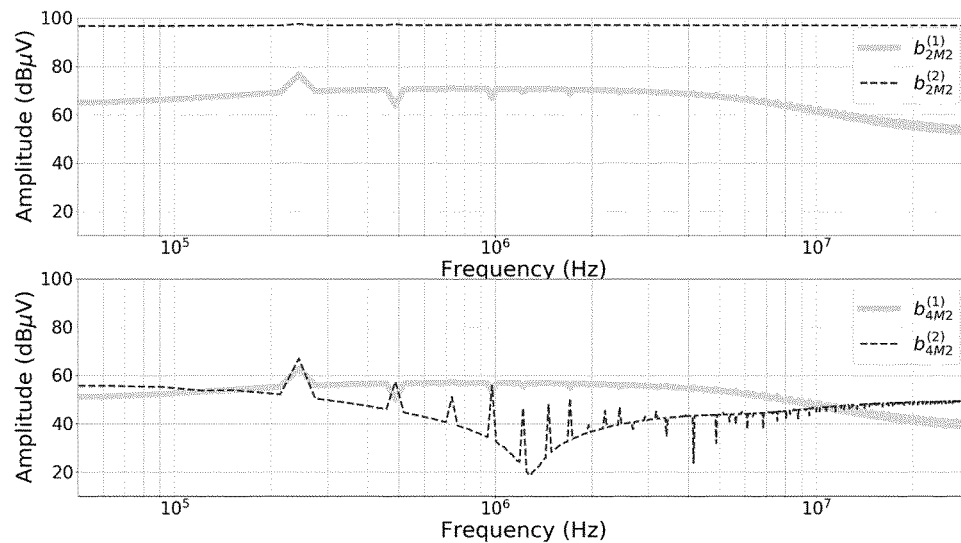
FIG. 10. Signals (1) $b_{2M2}$ and (2) $b_{4M2}$ measured with $V_{g1}$ switched off and $V_{g2}$ switched on for the same example of approach A of FIGS. 8 and 9.
Figure 11:
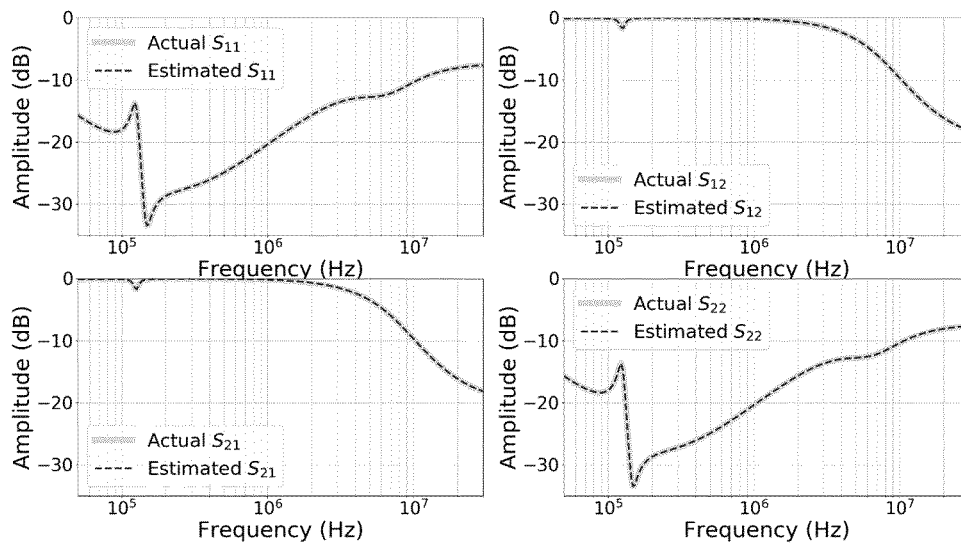
FIG. 11. Comparison of the four original and estimated S parameters of the EUT ($S_{EUT}$), for the same example of approach A of FIGS. 8, 9 and 10.

The Measurement steps for this case are:

a. The EUT of N ports (being N any number) is connected to the instrument and switched on.

b. The instrument measures the signals at port 2 and port 4 of the Coupling Networks with both generators $V_{g1}$ and $V_{g2}$ switched off. The signals measured are what was defined as $b_{2M0}$ and $b_{4M0}$. FIG. 8 shows this measurement.

c. The instrument measures the signals at port 2 and 4 with the first Generator switched on ($V_{g1}$ in this case), and the second switched off ($V_{g2}$ in this case) (an easy schema for generating linearly independent signals). The signal used in this particular example is a signal with a flat spectrum from 9 kHz to 30 MHz, although many other signals could be used instead. The injected signals interact with the EUT and are in part reemitted along with the EUT's emissions generated by $V_{n1}$ and $V_{n2}$. These signals arrive to the Measuring Unit through ports 2 and 4 of the Coupling Networks, where they are measured. In this case, the measured signals are shown in FIG. 9.

d. In a fourth step, the instrument measures the signals in port 2 and 4 of the coupling Networks with the second generator switched on ($V_{g2}$ in this case), and the first switched off ($V_{g7}$ in this case), and a signal with similar spectrum as above, as shown in FIG. 10.

e. Using the measurements done in the previous steps, the S parameters of the EUT, $S_{EUT}$, can be computed using Equation 1. In this example, the four S parameters are recovered, as shown in FIG. 11.

f. Having measured the S parameters of the EUT, the noise voltage sources can be obtained using:

$$V_N=(K_{3M}(I_N-S_{EUT})\cdot(I_N+S_{EUT}^{-1}(I_N-S_{33M}S_{EUT})S_{33M})S_{23M})^{-1}b_{2M0}. \quad \text{Equation 2}$$

Figure 12:
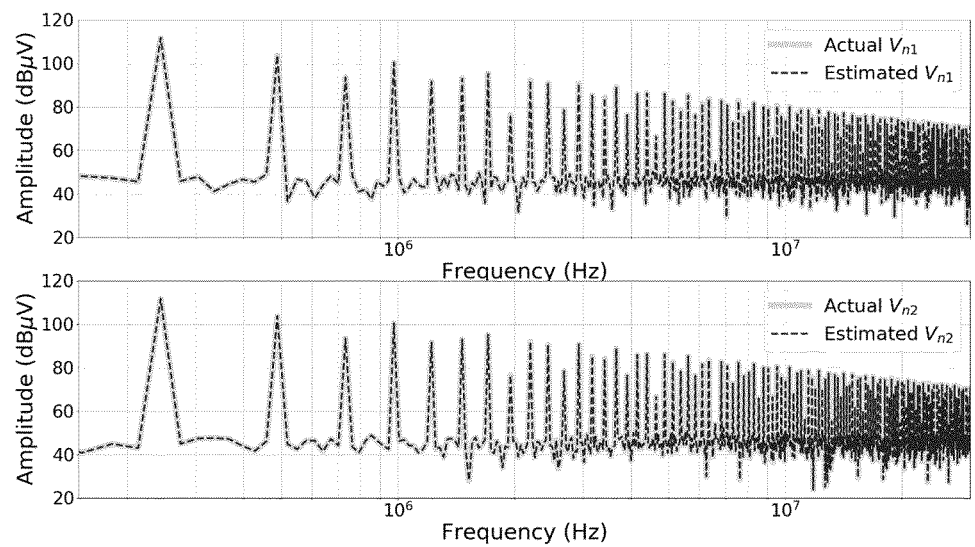
FIG. 12. Comparison of the original and estimated voltage noise sources $V_{n1}$ and $V_{n2}$ for the same example of approach A of FIGS. 8 to 11.

Applying this equation to our example, the two voltage noise sources are perfectly recovered, as shown in FIG. 12.

After these five steps, all the information to construct the Thevenin equivalent model of the EUT has been obtained.

Approach B:

Now, if the excitation is a spread-spectrum one, with the signal generators generating highly-uncorrelated sequences, all the above measurements could be performed simultaneously. The system would be simultaneously excited by N pseudonoise (PN) sequences and the response of the EUT recorded. Therefore, by performing N·N correlations of all responses by all PN sequences, response column vectors as those described above would be recovered, one for each exciting sequence (although this kind of measurements, and the associated correlations, are time-domain, as before they are characterized by their frequency-domain counterparts for analysis purposes):

$$b_{2M}=(S_{21M}+S_{23M}S_{EUT}(I_N-S_{33M}S_{EUT})^{-1}S_{31M})a_{1M}+b_{2M0}$$

$$b_{4M}=(S_{41M}+S_{43M}S_{EUT}(I_N-S_{33M}S_{EUT})^{-1}S_{31M})a_{1M}+b_{4M0}$$

$$b_{2M0}=S_{23M}a_{3M}=S_{23M}(I_N-S_{EUT}(I_N-S_{33M}S_{EUT})^{-1}S_{33M})(I_N-S_{EUT})K_{3M}V_n$$

$$b_{4M0}=S_{43M}a_{3M}=S_{43M}(I_N-S_{EUT}(I_N-S_{33M}S_{EUT})^{-1}S_{33M})(I_N-S_{EUT})K_{3M}V_n.$$

In this case, due to the spreading effect of the correlation to signals other than the exciting PN sequence, the terms $b_{2M0}$ and $b_{4M0}$ would have a low value and could generally be ignored.

Then, the matrices $$A=[a_{1M,1} \ldots a_{1M,N}]$$

$$B_2=[b_{2M,1}-b_{2M0} \ldots b_{2M,N}-b_{2M0}]\approx[b_{2M,1} \ldots b_{2M,N}]$$

$$B_4=[b_{4M,1}-b_{4M0} \ldots b_{4M,N}-b_{4M0}]\approx[b_{4M,1} \ldots b_{4M,N}],$$

could be constructed (the A matrix is also constructed by appropriately recording the N N correlation of the input PN sequences, and is, basically, a diagonal matrix at each measurement frequency), and the S-parameters matrix of the EUT could be obtained by $$S_{EUT}=(I_N+S_{23M}^{-1}(B_2A^{-1}-S_{21M})S_{31M}^{-1}S_{33M})^{-1}(S_{23M}^{-1}(B_2A^{-1}-S_{21M})S_{31M}^{-1})$$

Once $S_{EUT}$ is known, the interference vectors $b_{2M0}$ and $b_{4M0}$ can be recovered from $$b_{2M0}=b_{2m}-(S_{21M}+S_{23M}S_{EUT}(I_N-S_{33M}S_{EUT})^{-1}S_{31M})a_{1M}$$

$$b_{4M0}=b_{4m}-(S_{41m}+S_{43M}S_{EUT}(I_N-S_{33M}S_{EUT})^{-1}S_{31M})a_{1M},$$

this time using the PN excitations and their responses directly to perform the computations. From $b_{2M0}$ and $b_{4M0}$ the interference vector $$V_N=(K_{3M}(I_N-S_{EUT})\cdot(I_N+S_{EUT}^{-1}(I_N-S_{33M}S_{EUT})S_{33M})S_{23M})^{-1}b_{2M0},$$

can be obtained.

This schema of measurement has been presented only as an example to demonstrate that simultaneous measurements of all the parameters of a (generalized) Thevenin equivalent can be performed. As in the case of the more conventional measurement schemas described above, other measurement steps could be performed to arrive at the same result. For instance, the interference levels might be recovered first, and then the S-parameters of the circuit, or the generators could generate a superposition of PN sequences to achieve code-diversity in the measurements, or the measurement of interferences and S-parameters could be performed sequentially, among others. As before, this basic measurement schema can be enriched with algorithms and techniques which improve the numerical accuracy of the results (interpolations, multiple measurements, . . . ).

Example B: Consider the case of an EUT modelled using the characterization of FIG. 5, with the S-parameter network ($S_{EUT}$) shown in FIG. 6, and the two noise voltage sources ($V_{n1}$ and $V_{n2}$) shown in FIG. 7.

Again, all Coupling Networks considered for the instrument feature a CISPR-16 50Ω//50 μH LISN channel, an attenuator (transient limiter) and a directional coupler.

Figure 13:
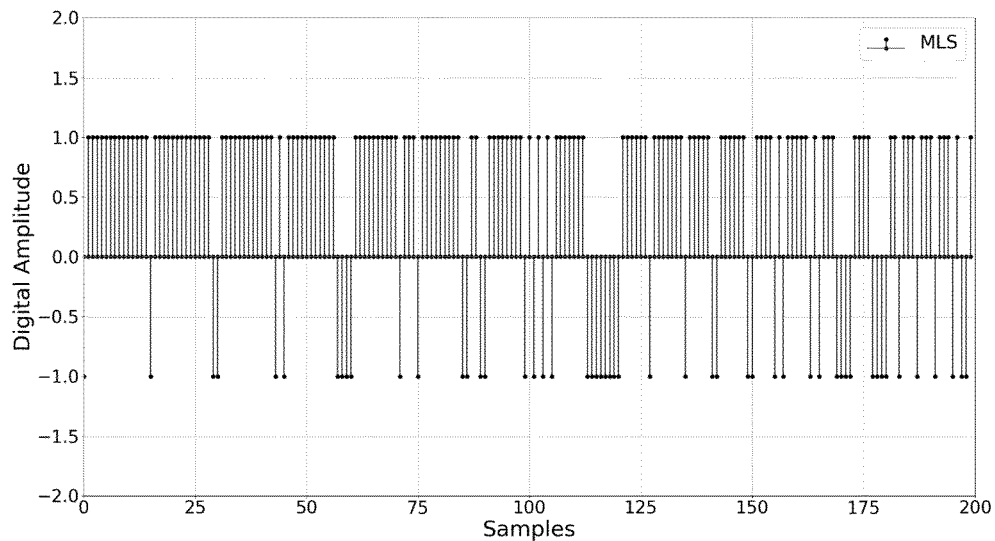
FIG. 13. First samples of the MLS sequence of 32767 chips used in the example of approach B.
Figure 14:
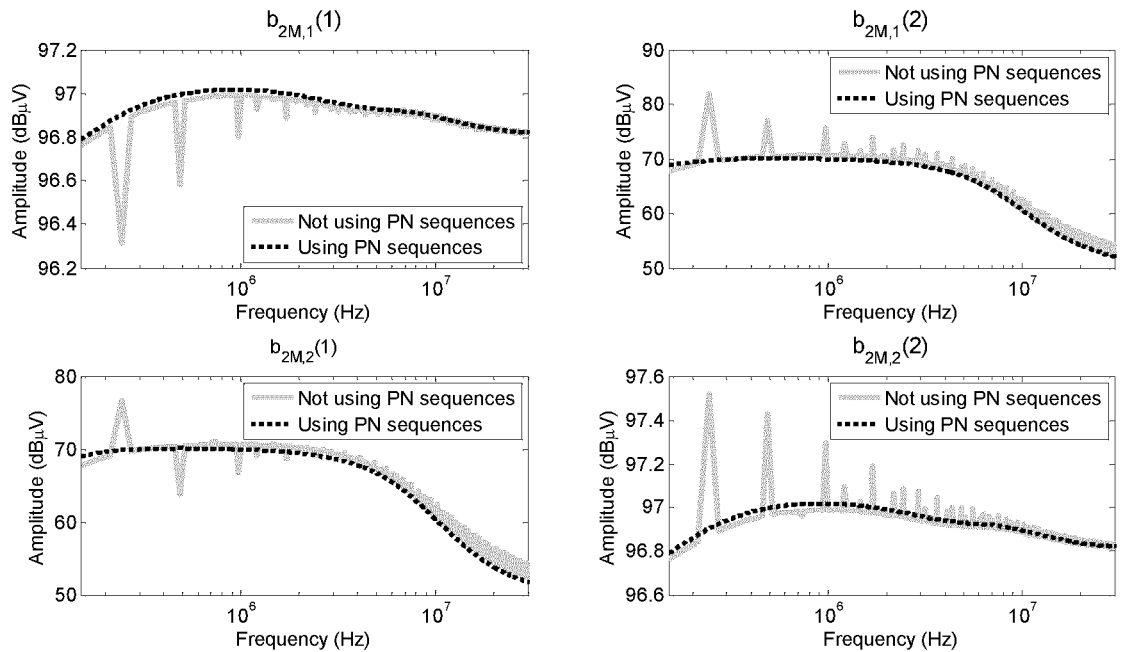
FIG. 14. Comparison results of the $b_{2M,1}$ and $b_{2M,2}$ matrices obtained with the previous method and the ones obtained with the PN sequences.
Figure 15:
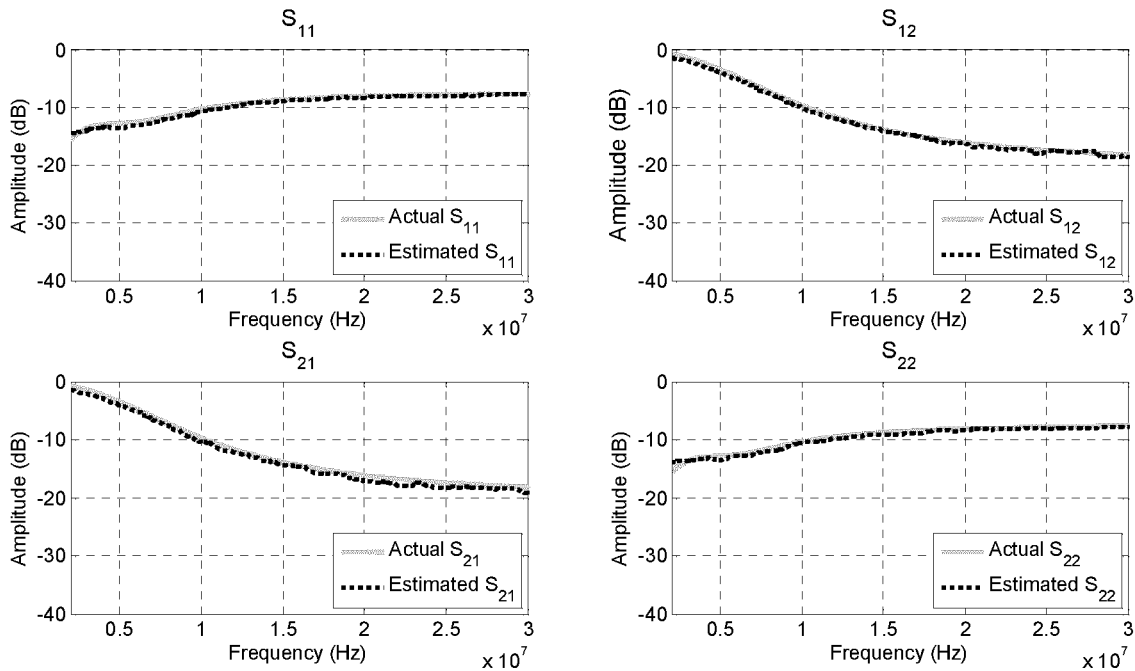
FIG. 15. The comparison between the actual S parameters of the EUT and the estimated ones.
Figure 16:
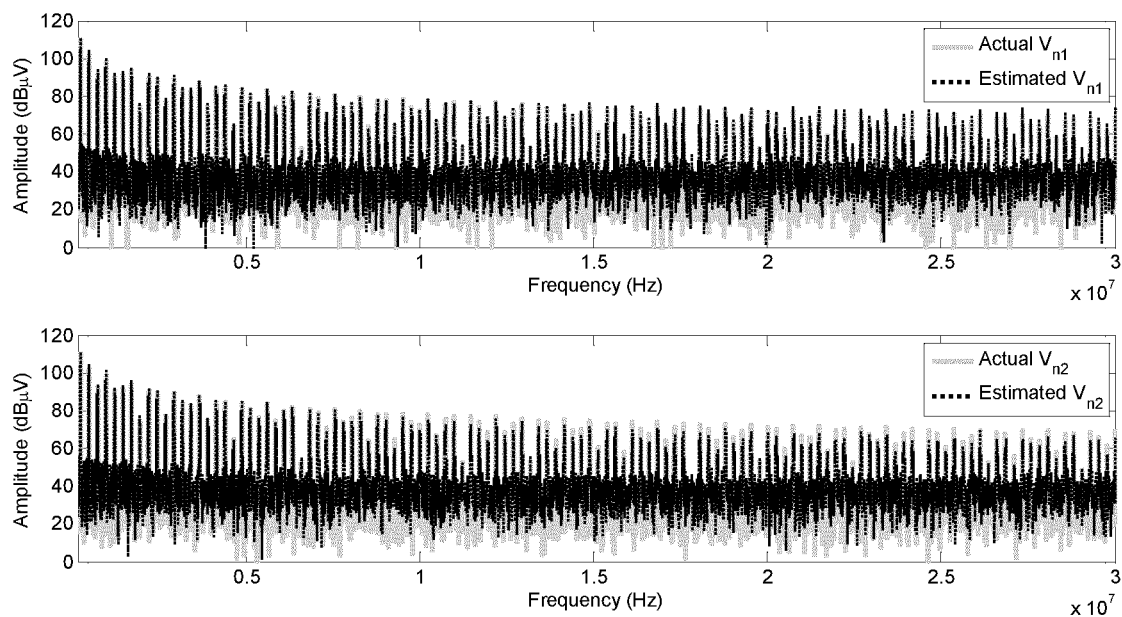

The Measurement steps for this case are:
a. The EUT of 2 ports is connected to the instrument and switched on.
b. The instrument generates the PN sequences. In this example, a single maximum-length (MLS) sequences of 32767 chips is used in both ports simultaneously, but with a time shift of 16384 samples (to avoid an overlapped interference). The measurement period is of 16384 samples. FIG. 13 shows its first 200 samples.
c. $a_{1M}$, $b_{2M}$ and $b_{4M}$ are simultaneously measured. These time-domain signals are correlated with the PN sequences. FIG. 14 shows the results of the $b_{2M,1}$ and $b_{2M,2}$ column vectors obtained after performing the cross-correlations with the PN sequences described above. A median filter has been used to smooth the effect of the interference.
d. Estimation of the S parameters of the EUT using equation 1. FIG. 15 shows the comparison between the actual S parameters of the EUT and the estimated ones. A median filter has been used to smooth the effect of the interference.
e. Estimation of the interferent sources. FIG. 16 shows the comparison between the interferent sources ($V_{n1}$ and $V_{n2}$) of the EUT and the estimated ones.

The two approaches described above are only presented as non-limiting examples of possible measurement strategies. The present invention embraces at least any measurement strategy including the generation and injection of the N test signals described in a previous section of the present document, at least those with the auto-correlation $R_{XX}$ and cross-correlation $R_{XY}$ described above.

Figure 17:
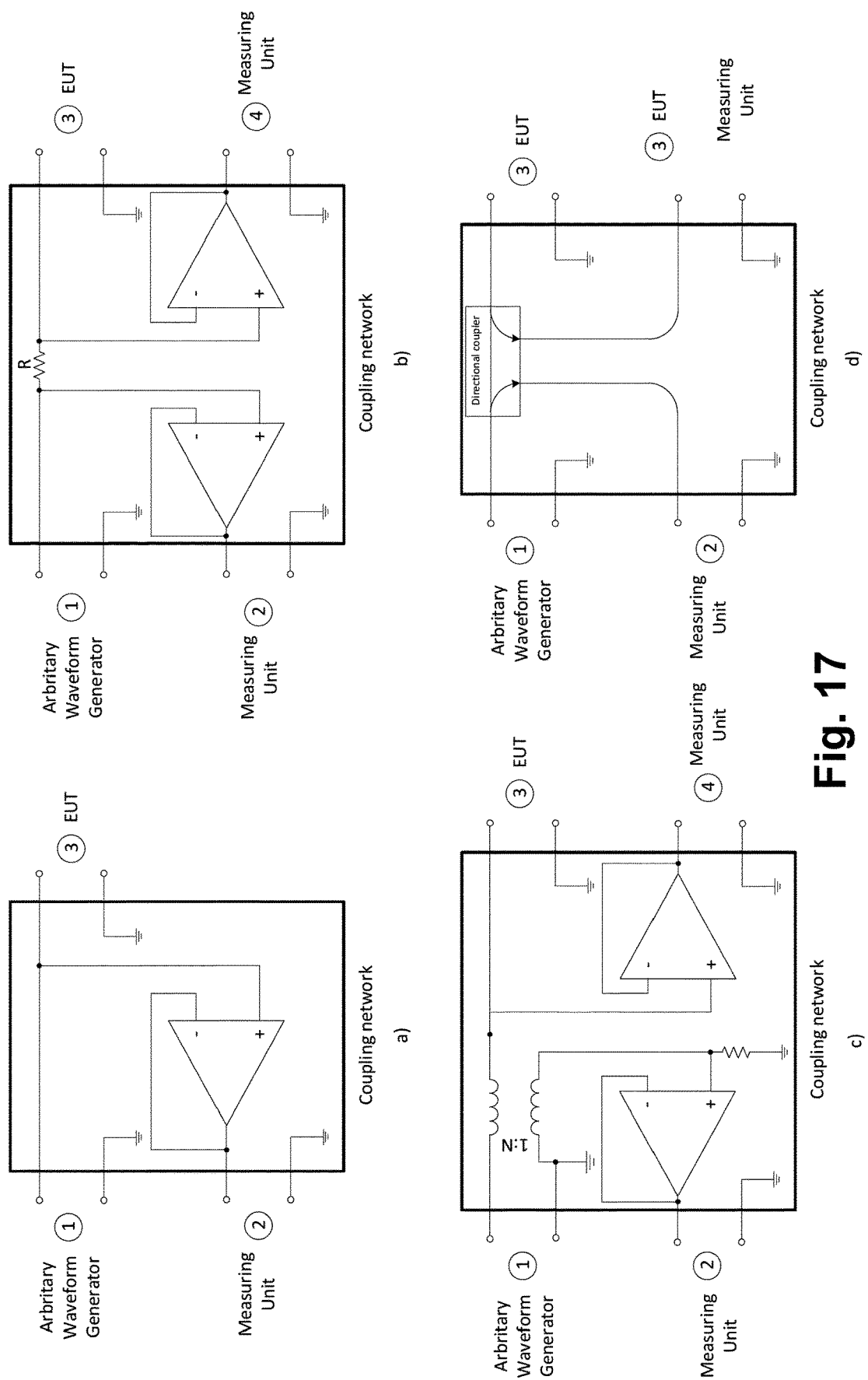
FIG. 17 shows four different examples of coupling networks of the measuring apparatus of the first aspect of the present invention, for different embodiments, particularly: a) a voltage follower; b) current meter; c) a transformer; d) a directional coupler.

Considering the definition given in the previous section of this document for the term Coupling Network, and taking into account the same port numeration shown in FIG. 3, some examples of coupling networks are shown in FIG. 17.

Specifically, FIG. 17.a) shows a coupling network for a Measuring Unit with a single port (k=1). This coupling network consists of a voltage follower (a voltage follower is a circuit whose output voltage straight away follows the input voltage).

FIG. 17.b) shows a coupling network for a Measuring Unit with two ports (k=2). In this case, the coupling network is composed of two voltage followers and a small value resistor. It allows the measurement of both the voltage at the port of the EUT (port 4), and of its current from the voltage drop across the resistor.

FIG. 17.c) shows an example of a coupling network using a transformer. Finally, FIG. 17.d) shows an example of a coupling network using only a directional coupler. In this case, part of the generated signal in the Arbitrary Waveform Generator goes to the Measuring Unit (port 2), and part to the EUT (port 3). On the other hand, the reflected signal in the EUT, or its conducted emissions, enter via port 3 and goes to the Measuring Unit via port 4.

The measuring apparatus of the first aspect of the present invention is more complex and complete than those known in the prior art, with a performance not available by any of them. It not only adds the possibility to simultaneously (or sequentially) measure the Z or Y or S parameters or any other meaningful set of parameters that can be computed from the aforementioned ones or from voltages and currents, and the electromagnetic signals or noise or electromagnetic interference generated by an EUT (or what is the same, its conducted emissions), but it also builds, for some embodiments, the Thevenin or Norton equivalent model and, as a last resort, finds the optimal power-line filter to mitigate the conducted emissions. This apparatus aims to accelerate the design and implementation of electronic EUTs, decreasing their design cost, optimizing its implementation and accelerating their time-to-market.

A person skilled in the art could introduce changes and modifications in the embodiments described without departing from the scope of the invention as it is defined in the attached claims. For example, substituting the above described LISNs internal to the Coupling Networks by one or more LISNs external thereto.

The invention claimed is:

1. A measuring apparatus, comprising:
an arbitrary waveform generator of N ports, wherein N is a natural number, configured and arranged to generate a combination of N test signals, one per port, and to inject said generated N test signals to the N ports of a coupling network;
said coupling network configured to couple the N test signals from said arbitrary waveform generator to an equipment under test (EUT) having M ports, where M is equal to, lower than or greater than N, and to couple the responses of the EUT to these N test signals and those signals generated by the EUT itself to a measuring unit;
said measuring unit having at least N ports, and being configured, made and arranged to measure the electrical signals provided by the coupling network; and
a processing unit configured, made and arranged to process said N test signals and said measured electrical signals, to obtain:
the electromagnetic signals or noise or electromagnetic interference (EMI) generated by the EUT at least at some of its ports; and
one or more parameters of the EUT, including Z or Y or S parameters of the EUT, or one or more parameters computed from the Z or Y or S parameters or from voltages and currents.

2. The measuring apparatus according to claim 1, wherein said arbitrary waveform generator is configured and arranged to generate said combination of N test signals from discrete sequences of length Z with auto-correlation $$Rxx\left(Rxx(n) = \frac{1}{L}\sum_{l=1}^{L} x[l]x^*[l+n]_L\right),$$

where $x^*$ represents the complex conjugate and $[l+n]_L$ represents a circular shift with a modulus outside the origin lower or equal than $1/\sqrt{L}$ for $n\neq 0$, and modulus of the cross-correlation Rxy $$\left(Rxy(n) = \frac{1}{L}\sum_{l=1}^{L} x[l]y^*[l+n]_L\right)$$

with a modulus lower or equal than $1/\sqrt{L}$.

3. The measuring apparatus according to claim 1, wherein the measuring unit has N, 2N or 3N ports.

4. The measuring apparatus according to claim 1, wherein the arbitrary waveform generator is configured and arranged to simultaneously generate said combination of N test signals and/or simultaneously inject the generated N test signals to the N ports of the coupling network, and wherein:
the measuring unit is configured, made and arranged to simultaneously measure the electrical signals provided by the coupling network; and
said processing unit is configured, made and arranged to process said N test signals and said measured electrical signals, to simultaneously obtain:
the electromagnetic signals or noise or electromagnetic interference (EMI) generated by the EUT at least at some of its ports; and
the Z or Y or S parameters of the EUT or the one or more parameters computed from the Z or Y or S parameters or from voltages and currents.

5. The measuring apparatus according to claim 1, wherein the arbitrary waveform generator is configured and arranged to at least sequentially inject the generated N test signals to the N ports of the coupling network, and wherein:
the measuring unit is configured, made and arranged to sequentially measure the electrical signals provided by the coupling network; and
said processing unit is configured, made and arranged to process said N test signals and said measured electrical signals, to sequentially obtain:
the electromagnetic signals or noise or electromagnetic interference (EMI) generated by the EUT at least at some of its ports; and
the Z or Y or S parameters of the EUT or the one or more parameters computed from the Z or Y or S parameters or from voltages and currents.

6. The measuring apparatus according to claim 1, wherein the aforementioned N test signals are tones or chirp signals or modulated signals or pulses or impulses or wideband signals covering a frequency range to be measured.

7. The measuring apparatus according to claim 1, wherein said processing unit comprises a processor to process said received measured electrical signals using correlation techniques with the injected N test signals, to separate data representative of said electromagnetic signals or noise or electromagnetic interference (EMI) generated by the EUT from data representative of said Z or Y or S parameters of the EUT or the one or more parameters computed from the Z or Y or S parameters or from voltages and currents.

8. The measuring apparatus according to claim 1, wherein the coupling network contains Line Impedance Stabilization Network (LISN) channels configured and arranged:
to electrically couple an AC power supply to the ports of the EUT, and
to electrically decouple the arbitrary waveform generator and the measuring unit from the AC power supply network.

9. The measuring apparatus according to claim 1, wherein the processing unit is configured, made and arranged to compute a modal decomposition of data representative of the aforementioned measured electrical signals.

10. The measuring apparatus according to claim 1, wherein said processing unit comprises EMC detectors applied directly on modal decomposition data representative of the aforementioned measured electrical signals.

11. The measuring apparatus according to claim 1, wherein the signal generator is configured to generate and inject N test signals with a period smaller than a switching period of the EUT, to characterize the variations along time of the electromagnetic signals or noise or electromagnetic interference (EMI) generated by the EUT and the Z or Y or S parameters of the EUT or any other meaningful set of parameters that can be computed from the aforementioned ones or from voltages and currents.

12. The measuring apparatus, according to claim 1, wherein said processing unit is configured, made and arranged to process the N test signals and the measured electrical signals, also to design:
a filter to attenuate the electromagnetic signals or noise or electromagnetic interference (EMI) generated by the EUT; and/or
a matching network for the optimal transference of the electromagnetic signals generated by the EUT.

13. A measuring method, comprising:
a) generating and injecting test signals to at least some of the ports of an EUT;
b) receiving electrical signals from said at least some of the ports of the EUT, after said test signals have been injected thereto,
c) simultaneously or sequentially measuring on the received electrical signals:
the electromagnetic signals or noise or electromagnetic interference (EMI) generated by the EUT at said at least some of its ports; and
the Z or Y or S parameters of the EUT or any one or more parameters computed from the Z or Y or S parameters or from voltages and currents.

14. The measuring method according to claim 13, comprising using a measuring apparatus comprising:
an arbitrary waveform generator of N ports, wherein N is a natural number, configured and arranged to generate a combination of N test signals, one per port, and to inject said generated N test signals to the N ports of a coupling network;
said coupling network configured to couple the N test signals from said arbitrary waveform generator to an equipment under test (EUT) having M ports, where M is equal to, lower than or greater than N, and to couple the responses of the EUT to these N test signals and those signals generated by the EUT itself, to a measuring unit;
said measuring unit having of at least N ports, and being configured, made and arranged to measure the electrical signals provided by the coupling network; and
a processing unit configured, made and arranged to process said N test signals and said measured electrical signals, to obtain:
the electromagnetic signals or noise or electromagnetic interference (EMI) generated by the EUT at least at some of its ports; and
the Z or Y or S parameters of the EUT or one or more parameters computed from the Z or Y or S parameters or from voltages and currents;
to perform the method steps, wherein:
said step a) comprises generating, as said test signals, said combination of N test signals with said arbitrary waveform generator, and simultaneously or sequentially injecting the same to at least some of the ports of the EUT through said coupling network;
said step b) comprises receiving through said coupling network said electrical signals, including said responses of the EUT to the N test signals and said signals generated by the EUT itself; and
said step c) comprises:

simultaneously or sequentially measuring, with said measuring unit, the electrical signals provided by the coupling network; and processing, with said processing unit, the N test signals and said measured electrical signals, to simultaneously or sequentially obtain:

the electromagnetic signals or noise or electromagnetic interference (EMI) generated by the EUT at least at some of its ports; and the Z or Y or S parameters of the EUT or one or more parameters computed from the Z or Y or S parameters or from voltages and currents.

15. The measuring method according to claim 13, wherein:

in said step b), said receiving step is a measuring step for measuring electrical signals from said at least some of the ports of the EUT, after said test signals have been injected thereto; and in said step c), said simultaneous or sequential measuring step refers to a processing/computing step for simultaneously or sequentially processing/computing from the measured electrical signals:

the electromagnetic signals or noise or electromagnetic interference (EMI) generated by the EUT at said at least some of its ports; and the Z or Y or S parameters of the EUT or one or more parameters computed from the Z or Y or S parameters or from voltages and currents.

16. The measuring method according to claim 15, comprising using a measuring apparatus comprising:

an arbitrary waveform generator of N ports, wherein N is a natural number, configured and arranged to generate a combination of N test signals, one per port, and to inject said generated N test signals to the N ports of a coupling network;

said coupling network configured to couple the N test signals from said arbitrary waveform generator to an equipment under test (EUT) having M ports, where M is equal to, lower than or greater than N, and to couple the responses of the EUT to these N test signals and those signals generated by the EUT itself, to a measuring unit;

said measuring unit having at least N ports, and being configured, made and arranged to measure the electrical signals provided by the coupling network; and a processing unit configured, made and arranged to process said N test signals and said measured electrical signals, to obtain:

the electromagnetic signals or noise or electromagnetic interference (EMI) generated by the EUT at least at some of its ports; and the Z or Y or S parameters of the EUT or one or more parameters be computed from the Z or Y or S parameters or from voltages and currents;

to perform the method steps, wherein:

said step a) comprises generating, as said test signals, said combination of N test signals with said arbitrary waveform generator, and simultaneously or sequentially injecting the same to at least some of the ports of the EUT through said coupling network;

said step b) comprises simultaneously or sequentially measuring, with said measuring unit, the electrical signals provided by the coupling network, including said responses of the EUT to the N test signals and said signals generated by the EUT itself; and said step c) comprises:

processing, with said processing unit, the N test signals and said measured electrical signals, to simultaneously or sequentially compute:

the electromagnetic signals or noise or electromagnetic interference (EMI) generated by the EUT at least at some of its ports; and the Z or Y or S parameters of the EUT or one or more parameters computed from the Z or Y or S parameters aforementioned ones or from voltages and currents.

17. The measuring method according to claim 13, comprising:

building a circuit model or modal model of the EUT; and designing an optimal power filter or matching network, and/or components thereof, by predicting the levels of electromagnetic signals or noise or EMI generated by the EUT when virtually connect said built circuit and/or modal models to electric filter or matching network components and simulate their operation.

* * * * *